United States Patent

Hause et al.

[11] Patent Number: 6,069,384
[45] Date of Patent: *May 30, 2000

[54] INTEGRATED CIRCUIT INCLUDING VERTICAL TRANSISTORS WITH SPACER GATES HAVING SELECTED GATE WIDTHS

[75] Inventors: Frederick N. Hause, Austin; Mark I. Gardner, Cedar Creek, both of Tex.

[73] Assignee: Advanced Micro Devices, Inc., Sunnyvale, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/811,416

[22] Filed: Mar. 4, 1997

[51] Int. Cl.[7] .................... H01L 29/76; H01L 29/94; H01L 31/062; H01L 31/113
[52] U.S. Cl. .................... 257/330; 438/156; 438/192; 438/268
[58] Field of Search ...................... 257/329–31; 438/156, 438/192, 268

[56] References Cited

U.S. PATENT DOCUMENTS

| | | |
|---|---|---|
| 4,589,193 | 5/1986 | Goth et al. . |
| 4,717,682 | 1/1988 | Taka et al. . |
| 4,916,083 | 4/1990 | Monkowski et al. . |
| 4,992,838 | 2/1991 | Mori ........................................ 257/330 |
| 5,016,067 | 5/1991 | Mori ........................................ 257/330 |
| 5,032,882 | 7/1991 | Okumura et al. . |
| 5,077,228 | 12/1991 | Eklund et al. . |
| 5,164,325 | 11/1992 | Cogan et al. . |
| 5,242,845 | 9/1993 | Baba et al. . |
| 5,250,450 | 10/1993 | Lee et al. . |
| 5,312,767 | 5/1994 | Shimizu et al. ......................... 438/268 |
| 5,358,884 | 10/1994 | Voilette . |
| 5,429,977 | 7/1995 | Lu et al. . |
| 5,464,780 | 11/1995 | Yamazaki . |
| 5,670,810 | 9/1997 | Tamaki et al. .......................... 257/331 |
| 5,693,549 | 12/1997 | Kim ........................................ 438/157 |
| 5,705,409 | 1/1998 | Witek . |
| 5,719,067 | 2/1998 | Gardner et al. . |
| 5,721,148 | 2/1998 | Nishimura . |
| 5,726,088 | 3/1998 | Yanagiya et al. . |
| 5,770,514 | 6/1998 | Matsuda et al. . |
| 5,773,343 | 6/1998 | Lee et al. . |
| 5,872,037 | 2/1999 | Iwamatus et al. ...................... 438/268 |
| 5,909,618 | 6/1999 | Forbes et al. .......................... 438/242 |

FOREIGN PATENT DOCUMENTS 3-3478 2/1991 Japan ..................... 257/331

*Primary Examiner*—Olik Chaudhuri
*Assistant Examiner*—Howard Weiss
*Attorney, Agent, or Firm*—Skjerven, Morrill, MacPherson, Franklin & Friel, L.L.P.; Ken J. Koestner

[57] ABSTRACT

Improvements in the compactness and performance of integrated circuit devices are gained through the fabrication of vertical transistors for which channel sizes are determined by the accuracy of etch techniques rather than the resolution of photolithographic techniques. A method of fabricating an integrated circuit includes forming a plurality of doped layers in a series of depths in a substrate wafer, and etching a trench in the substrate wafer. The trench extends through the doped layers at a plurality of depths and is bounded by vertical sidewalls and a planar horizontal floor. The method further includes forming a conductive sidewall spacer adjacent to the vertical sidewalls of the trench.

25 Claims, 5 Drawing Sheets

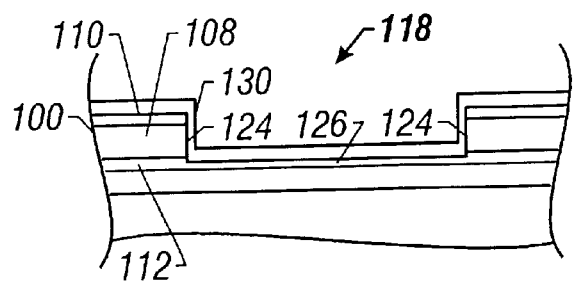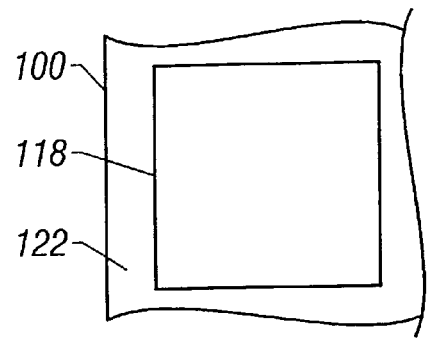
FIG. 4D-1   FIG. 4D-2
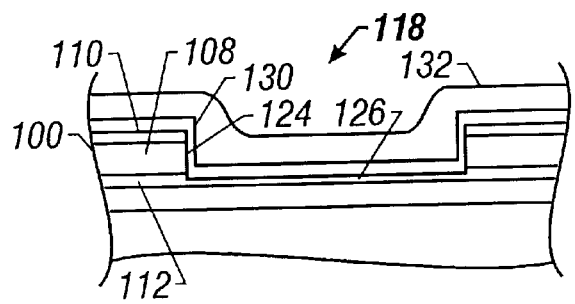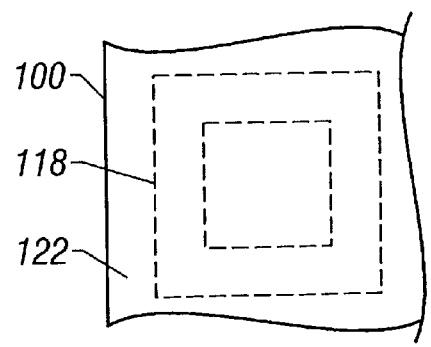
FIG. 4E-1   FIG. 4E-2
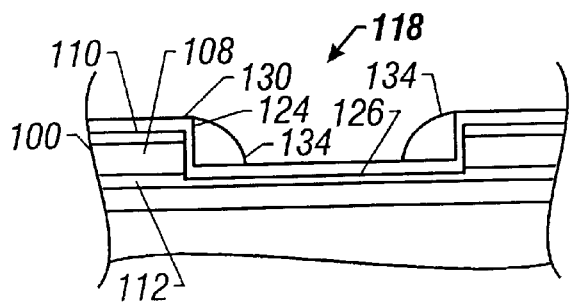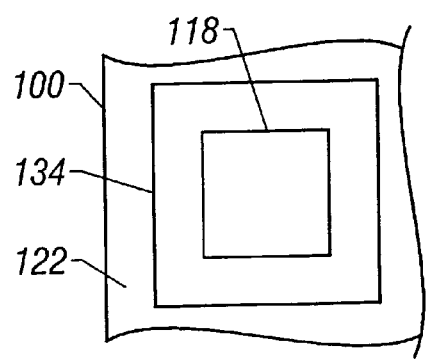
FIG. 4F-1   FIG. 4F-2

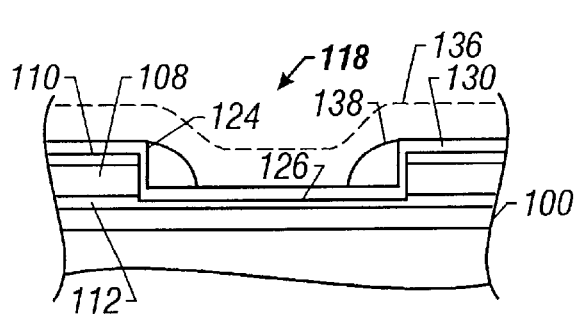
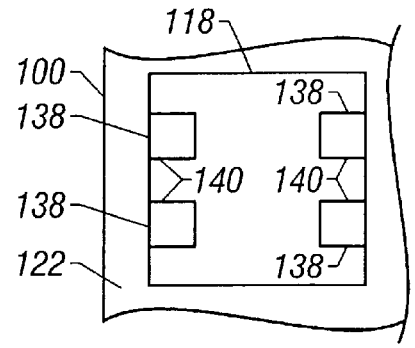
FIG. 4G-1
FIG. 4G-2
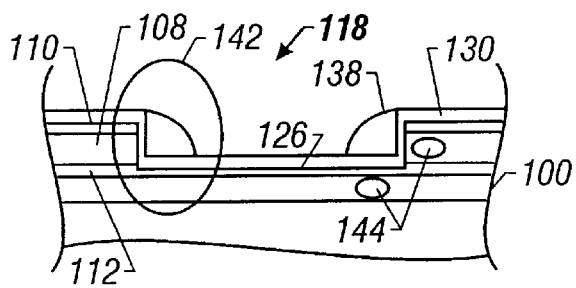
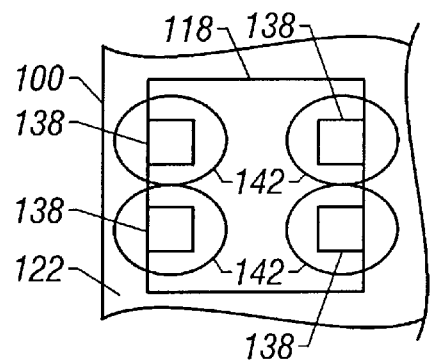
FIG. 4H-1
FIG. 4H-2
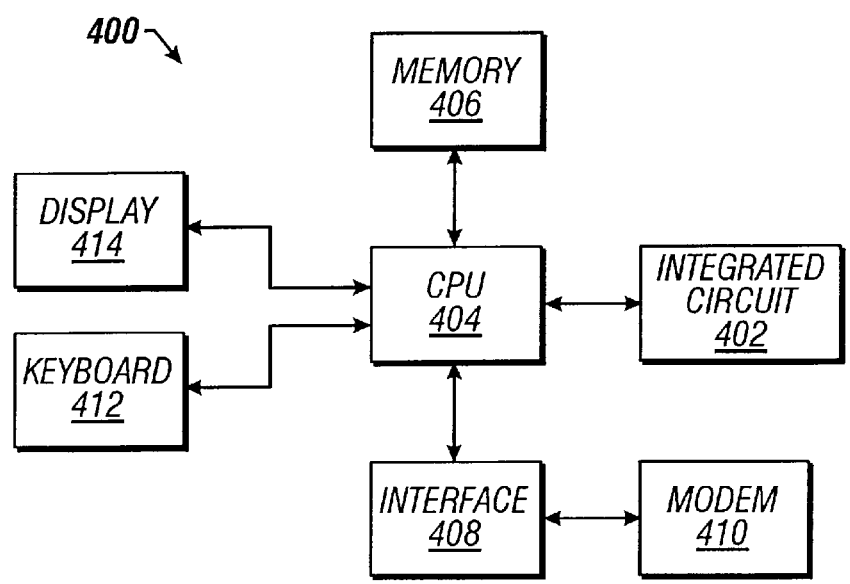
FIG. 5

INTEGRATED CIRCUIT INCLUDING VERTICAL TRANSISTORS WITH SPACER GATES HAVING SELECTED GATE WIDTHS

BACKGROUND OF THE INVENTION

1. Field of the Invention

The present invention relates to an integrated circuit and fabrication method. More specifically, the present invention relates to an integrated circuit including vertical transistors with spacer gates.

2. Description of the Related Art

A key concept in the evolution of MOSFET integrated circuits is the usage of scaling to continually reduce the size of devices and thereby increase the density and speed of digital integrated circuits. The density of integrated circuits is improved by using smaller channel lengths and channel widths. The speed of digital integrated circuits is improved by increasing the saturation drain current $I_{dsat}$ of MOSFET devices, thereby promoting faster charging and discharging of parasitic capacitances. Fortunately, an increase in the saturation drain current $I_{dsat}$ of MOSFET devices automatically results from a decrease in channel length or a reduction in gate oxide thickness. In fact, models of MOSFET functionality imply that the saturation drain current $I_{dsat}$ will continue to increase indefinitely as the channel length and gate oxide thickness are reduced so that only limitations of process technology rather than device effects prevent the design and manufacture of ever smaller and increased performance MOSFETs.

The fabrication of increasingly smaller features in integrated circuits depends on the availability of increasingly higher resolution photolithography equipment. Increases in resolution have been gained by decreasing the illuminating wavelength of the optical equipment or increasing the numerical aperture of the system lens. Other techniques for increasing the resolution of photolithography equipment include increasing the contrast of the photoresist mask applied to the imaged semiconductor wafer. The contrast of the photoresist mask is increased by modifying the resist chemistry, creating entirely new photoresists, or using contrast enhancement layers to allow a smaller modulation transfer function to produce adequate images. Further enhancements are gained by adjusting the coherence of the optical system.

All of these techniques have been employed with varying degrees of success. However, further improvements in integrated circuit density and performance are continually sought.

What is needed is a technique for accurately and consistently creating smaller and increased performance MOSFETs.

SUMMARY OF THE DESCRIPTION

It has been discovered that improvements in the compactness and performance of integrated circuit devices are gained through the fabrication of vertical transistors for which channel sizes are determined by the accuracy of etch techniques rather than the resolution of photolithographic techniques. Etching in the vertical dimension is precisely controlled to resolutions of about 0.025 μm while advanced photolithographic techniques in a volume production environment achieve resolutions of 0.25 μm.

In accordance with an embodiment of the present invention, a method of fabricating an integrated circuit includes forming a plurality of doped layers in a series of depths in a substrate wafer, and etching a trench in the substrate wafer. The trench extends through the doped layers at a plurality of depths and is bounded by vertical sidewalls and a planar horizontal floor. The method further includes forming a conductive sidewall spacer adjacent to the vertical sidewalls of the trench.

In accordance with another embodiment of the present invention, an integrated circuit includes a plurality of doped layers in a series of depths in a substrate wafer and a trench etched into the substrate wafer. The trench extends through the doped layers at a plurality of depths and being bounded by vertical sidewalls and a planar horizontal floor. The integrated circuit further includes a conductive sidewall spacer adjacent to the vertical sidewalls of the trench.

Many advantages are gained by the described integrated circuit and fabrication method. The method advantageously forms a highly compact structure in which multiple transistors are formed in a very small area. The compact structure improves integrated circuit density and improves digital circuit performance. The fabrication method accurately, consistently, and highly controllably forms integrated circuit transistors and devices having channel widths that are substantially smaller than channel widths that are created using conventional photolithographic techniques.

It is further advantageous that the described fabrication method uses a gate polysilicon mask that selectively patterns the polysilicon gates to individually set the gate width of particular transistors. It is advantageous that the individual gate widths are formed using a single masking procedure.

BRIEF DESCRIPTION OF THE DRAWINGS

The features of the described embodiments believed to be novel are specifically set forth in the appended claims. However, embodiments of the invention relating to both structure and method of operation, may best be understood by referring to the following description and accompanying drawings.

FIGS. 4A-1 and 4A-2 through 4H-1 and 4H-2 are sequences of respective schematic cross-section views and schematic top views of a silicon wafer undergoing processing of a series of integrated circuit processing steps.

FIG. 5 is a schematic block diagram illustrating a computer system including an integrated circuit including vertical transistors with spacer gates fabricated using a method as depicted in FIGS. 4A-1 and 4A-2 through 4H-1 and 4H-2.

DETAILED DESCRIPTION OF THE ILLUSTRATIVE EMBODIMENTS

Figure 1:
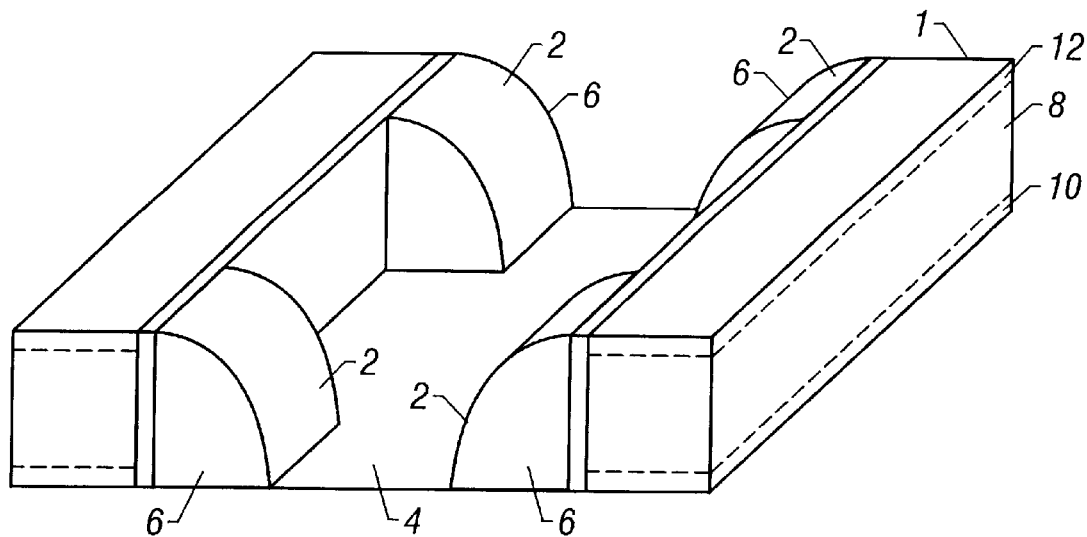
FIG. 1 shows a pictorial three-dimensional view of a first embodiment of an integrated circuit using a masking technique to form multiple spacer transistors with individually selected gate widths on two sides of an etched trench.

Referring to FIG. 1, a pictorial three-dimensional view shows an embodiment of an integrated circuit using a masking technique to form multiple spacer transistors with individually selected gate widths. A silicon wafer 1 includes a plurality of transistors 2 formed in a trench 4 etched into the wafer 1. While the illustration shows a silicon wafer 1 with four transistors 2, any number of transistors may be included in a particular embodiment. While the trench 4 is illustrated as a rectangular trench, other shapes and forms of trenches may be formed in various embodiments. The transistors 2 include a polysilicon gate 6 which is formed from a sidewall spacer on the edges of the trench 4. The transistors 2 also include a channel region 8 extending vertically within the silicon wafer 1 on the sides of the trench 4, and a source region 10 and a drain region 12 bounding the channel region 8. The source region 10 and the drain region 12 overlie and underlie the channel region 8. The width of the channel region 8 determines the size of the transistors 2 and is selected within very compact ranges such as a range from 0.1 µm to 0.3 µm, advantageously forming a highly compact structure in which multiple transistors are formed in a very small area. A gate polysilicon mask (not shown) is selectively patterned to control the widths of the various polysilicon gates 6 so that the gate widths may be individually selected using a single masking process.

Figure 2:
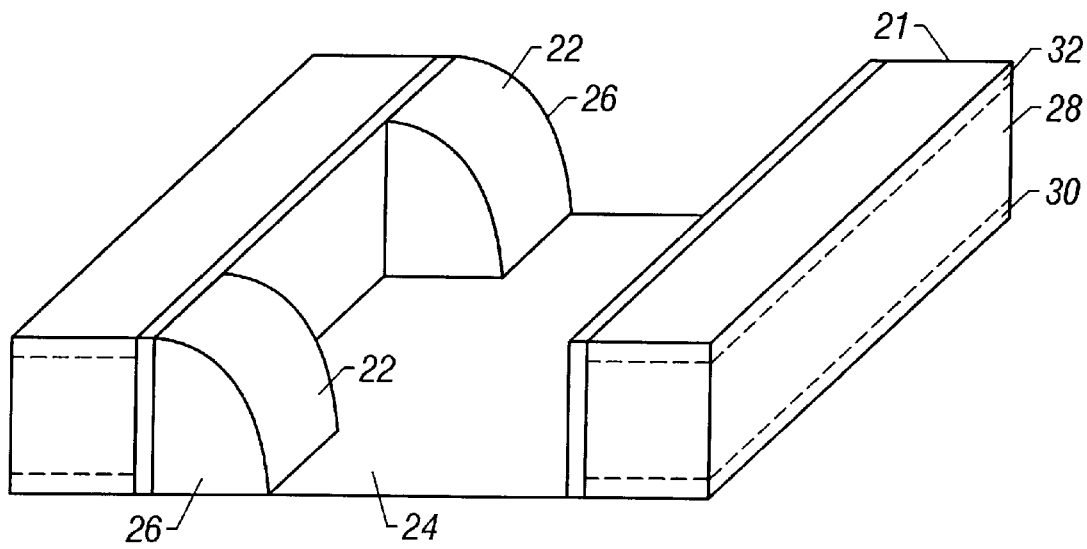
FIG. 2 shows a pictorial three-dimensional view of a second embodiment of an integrated circuit using the masking technique to form multiple spacer transistors with individually selected gate widths on only one side of an etched trench.

Referring to FIG. 2, a pictorial three-dimensional view shows a second embodiment of an integrated circuit using a masking technique to form multiple spacer transistors with individually selected gate widths. A silicon wafer 21 includes a plurality of transistors 22 formed in a trench 24 etched into the wafer 21. A masking process is used to form transistors 22 on only one side of the trench 24. The transistors 22 include a polysilicon gate 26 which is formed from a sidewall spacer on the edges of the trench 4. The transistors 22 also include a channel region 28 extending vertically within the silicon wafer 21 on the sides of the trench 24, and a source region 30 and a drain region 32 bounding the channel region 28. The source region 30 and the drain region 32 overlie and underlie the channel region 28. The width of the channel region 28 determines the size of the transistors 22 and is selected within very compact ranges such as a range from 0.1 µm to 0.3 µm, advantageously forming a highly compact structure in which multiple transistors are formed in a very small area. A gate polysilicon mask (not shown) is selectively patterned to control the widths of the various polysilicon gates 26 so that the gate widths may be individually selected using a single masking process.

Figure 3:
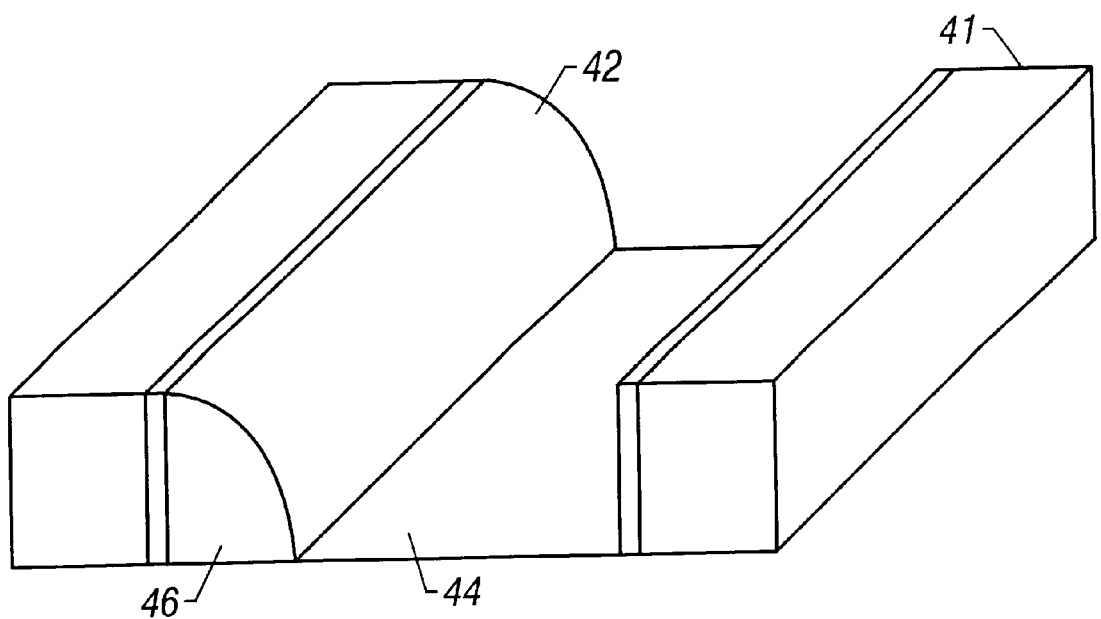
FIG. 3 shows a pictorial three-dimensional view of a third embodiment of an integrated circuit using the masking technique to form an interconnect structure connecting multiple devices on a semiconductor wafer.

Referring to FIG. 3, a pictorial three-dimensional view shows a third embodiment of an integrated circuit using a masking technique to form a polysilicon interconnect structure 42 connecting multiple devices on a semiconductor wafer 41. A silicon wafer 41 includes a plurality of devices (not shown) formed adjacent to a trench 44 etched into the wafer 41. The interconnect structure 42 is formed by depositing a blanket layer of undoped polysilicon by low pressure chemical vapor deposition (LPCVD) on the top surface of the silicon wafer 41. The undoped polysilicon is etched using an anisotropic dry etch process that is selective to polysilicon over $SiO_2$ etching to avoid etching of underlying gate oxide. The anisotropic dry-etch process clears undoped polysilicon in planar areas of the surface regions and the floor of the trench 44 in the silicon wafer 41 while leaving the interconnect structure 42 on vertical sidewalls 46 of the trench 44. The interconnect structure 42 is etched to an endpoint with minimal over-etch so that the height of the polysilicon interconnect structure 42 is substantially the same height as the vertical sidewalls 46 of the trench 44. For a height of 0.3 µm and a deposited polysilicon film thickness of about 0.3 µm, the width of the interconnect structure 42 is approximately 0.2 µm.

FIGS. 4A-1 and 4A-2 through 4H-1 and 4H-2 are sequences of respective schematic cross-section views and schematic top views of a silicon wafer 100 undergoing processing of a series of integrated circuit processing steps.

Figures 1, 4A:
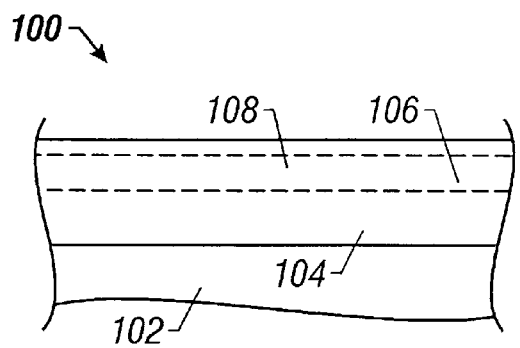
Figures 2, 4A:
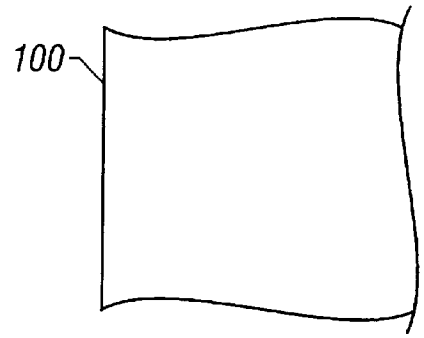

Referring to FIGS. 4A-1 and 4A-2, various suitable processing steps are performed to form a plurality of transistor structures. In one exemplary embodiment, NMOS devices in an N-well technology are formed in a lightly doped P-substrate having a P-type impurity concentration of greater than approximately $10^{15}/cm^3$ and PMOS devices are formed in a more heavily-doped N-type substrate having an impurity concentration of less than $10^{16}/cm^3$. The starting material is typically a heavily-doped <100>-orientation silicon substrate 102 having a quality suitable for integrated circuit manufacture, upon which a thin (5 µm to 10 µm) lightly-doped epitaxial layer 104 is grown. The illustrative epitaxial layer 104 is a P-type epitaxial surface layer with a <100> orientation and a resistivity of 12 ohm-cm. Either an n-epi-on-n$^+$ or a p-epi-on-p$^+$ substrate may be used for the epitaxial layer 104. The a p-epi-on-p$^+$ substrate is more typically used due to a lesser sensitivity to process-induced defects. The silicon substrate 102 and the epitaxial layer 104 in combination form a silicon wafer 100.

Ions are implanted into the silicon wafer 100 to adjust a threshold voltage $V_T$. In embodiments including a P-layer, an N-layer, or both a P-layer and an N-layer, the threshold voltage $V_T$ is adjusted by ion implantation for both enhancement mode and depletion mode transistors. Ion implantation is used to set threshold voltage $V_T$, advantageously allowing the threshold voltage $V_T$ to be set independently of substrate doping, allowing substrate doping to be set on the basis of device performance alone. Adjustment of threshold voltage $V_T$ is achieved by implanting impurities such as boron, phosphorus, or arsenic ions into regions beneath the gate oxide of a MOSFET. Boron atoms positively shift threshold voltage $V_T$. Phosphorus or arsenic atoms negatively shift threshold voltage $V_T$. The threshold voltage $V_T$ adjustment implant is performed either with a single boron implant or separate p-type and n-type implants using additional masking steps.

In the illustrative embodiment, threshold adjustment implants and punchthrough implants are implanted prior to growth of a gate-oxide layer on the silicon wafer 100 surface. In various embodiments, threshold adjustment implants and punchthrough implants may be performed either before or after formation of a trench or before or after gate-oxide growth. In conventional devices, the threshold voltage $V_T$ adjustment implant is injected through the gate oxide layer to limit depth of the boron threshold adjustment implant to a shallow depth. A suitable threshold voltage $V_T$-adjust implant energy forms an implant with a peak concentration at the oxide-silicon interface. A subsequent implant-activating anneal operation distributes the implanted ions more broadly than the implanted profile.

In an illustrative embodiment, a threshold voltage $V_T$ adjustment implant for enhancement-mode devices is performed. For example, boron is implanted at a concentration in a range from approximately $10^{12}$ to $10^{13}$ atoms/cm$^2$ and an energy in the range from about 50 keV to 100 keV, an energy insufficient to penetrate a trench or field oxide isolation (not shown). The $V_T$ adjustment implant for enhancement-mode devices is typically performed without masking.

A threshold voltage $V_T$ adjustment implant for depletion-mode devices is performed by implanting areas of depletion-mode devices with phosphorus atoms at a concentration of about $10^{12}$ atoms/cm$^2$ and an implant energy in the range of about 100 keV to 200 keV. The implant dosage is adjusted to overcompensate for the boron threshold voltage $V_T$ adjustment implant for enhancement-mode devices. The depletion-mode implant is performed with a photoresist mask to selectively locate the depletion-mode transistor channels.

In the illustrative embodiment, a doped P-layer 106 is formed in the silicon wafer 100 so that a plurality of p-channel transistors are fabricated in the same wafer in CMOS technologies. In other embodiments, a doped N-layer may be formed to fabricate a plurality of N-channel transistors. In further embodiments, a P-layer is formed in some portions of the silicon wafer and an N-layer is formed in other portions of the silicon wafer so that both N-channel and P-channel transistors are formed in a single wafer.

N-layers and P-layers are regions of opposite doping that are the first features defined on a silicon wafer. N-layers and P-layers are formed by implanting and diffusing appropriate dopants, for example phosphorus or arsenic for N-layers and boron for P-layers to attain a suitable well depth and doping profile. The dual layers may be formed using various techniques. In one example, the two layers are formed using two masking steps, each of which blocks one of the implants.

In the illustrative embodiment, the P-layer 106 is formed by doping the silicon wafer 100 with a boron or $BF_2$ implant at a suitable energy and implant intensity. The P-layer 106 doping forms a P-channel region 108 that serves as the channel for the plurality of P-channel transistors.

The P-layer 106, or in an alternative embodiment the N-layer, is rapid thermal annealed (RTA) for example at a temperature of 1000° C. to 1100° C. for 30 seconds. Following the anneal step, the concentration in the layer is suitable for subsequent processing. In one example, a 0.8 μm CMOS process, a suitable P-layer 106 concentration is about $10^{16}$/cm$^3$ while a suitable N-layer concentration is about $3 \times 10^{16}$/cm$^3$.

Typically, a channel-stop procedure is included in the process sequence for forming the wells. Various procedures are used to form channel-stop implants. In one embodiment, a single P-layer channel-stop implant of boron is used since doping in the N-layer is generally sufficient that a second channel-stop is not necessary. Alternatively, separate channel-stop implants may be implemented for the P-layers and the N-layers. In this process, boron is implanted into both the P-layers and the N-layers so that a phosphorus channel-stop implant is increased to compensate for the boron implant of the N-layer regions. Also alternatively, a maskless channel-stop procedure is used in which both boron and phosphorus are implanted into the N-layer regions, placing both dopants that form the layer and the dopants forming the channel-stop into the N-layer regions prior to implanting of the P-layers. An oxide is then grown on the N-layer regions and the boron implant for the P-layer is implanted. The N-layers are annealed, the oxide layer overlying the N-layers is retained, and a second boron implant is performed, serving both as a channel-stop implant in the P-layer field regions and a punchthrough prevention implant in the active regions of the P-layer 106.

Figures 1, 4B:
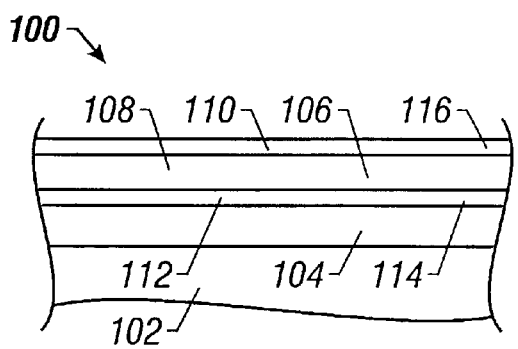
Figures 2, 4B:
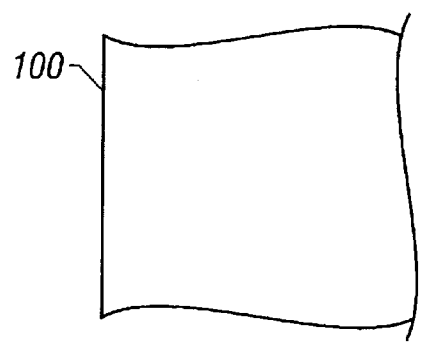

Following implantation for channel doping, threshold voltage $V_T$ adjustment, and punchthrough control, drain and source implants are performed as is shown with reference to FIGS. 4B-1 and 4B-2. In the illustrative embodiment of a silicon wafer 100 including a channel formed of a doped P-layer 106, N-type dopant atoms are implanted for form a drain layer 110 and a source layer 112. An N-type species is implanted to a suitable depth into the silicon wafer 100 by controlling the implant energy and by selection of the species. A suitable channel width is selected and the drain layer 110 and source layer 112 are implanted at a depth in the silicon wafer 100 that attains the selected channel width. For example, the P-layer 106 is bounded by a first N-type implant 114 at a depth in a range from approximately 0.025 μm to 0.3 μM and a second N-type implant 116 at the surface of the silicon wafer 100 to achieve a P-channel width of about 0.025 μm to 0.3 μm. The first N-type implant 114 is typically a phosphorus or arsenic implant. In one example, phosphorus is implanted at a depth of approximately 0.3 μm by injecting phosphorus ions at a dosage in a range from $1 \times 10^{15}$ to $5 \times 10^{15}$ atoms/cm$^2$ and an energy in the range of 100 keV to 300 keV. The second N-type implant 116, for a shallow source arsenic is implanted at a dosage in a range from $1 \times 10^{15}$ to $5 \times 10^{15}$ atoms/cm$^2$ and an energy in the range of 2 keV to 30 keV. In one example, arsenic is implanted at a depth of approximately at the surface of the silicon wafer 100 by injecting arsenic ions at a dosage in a range from $1 \times 10^{18}$ to $1 \times 10^{19}$ atoms/cm$^2$ and an energy in the range of 2 to 30 kiloelectron-volts (keV).

Figures 1, 4C:
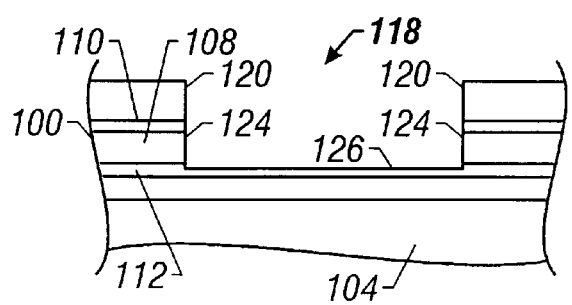
Figures 2, 4C:
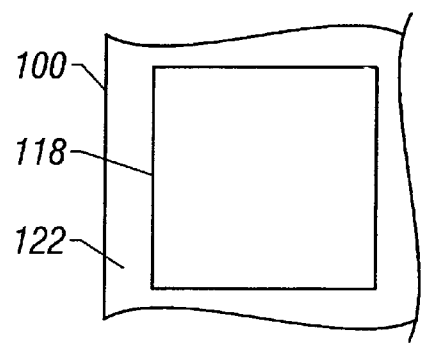

Referring to FIGS. 4C-1 and 4C-2, a trench 118 is formed in the silicon wafer 100 to a selected depth, typically in a range from 0.025 μm to 0.25 μm. Although the trench 118 is illustratively formed following the source/drain implant, in other embodiments, the source/drain implants may be performed after the trench 118 is etched. The trench 118 is formed using any suitable etch technique including anisotropic and isotropic etch procedures, and wet and dry etch techniques. Generally substantially vertical walls of the trench 118 are desired so that anisotropic etching is highly suitable in comparison to isotropic etching. Furthermore, dry etch techniques are highly suitable in comparison to wet etch techniques to achieve a uniform and controlled trench depth.

In the illustrative embodiment, the trench 118 is formed using an anisotropic dry etch that is suitable for etching silicon. Suitable etch techniques include plasma etch processes, reactive ion etching (RIE) processes, and the like. The trench 118 is formed by patterning a photoresist mask 120 over the surface of the silicon wafer 100 and is shown in a rectangular shape in the top view of FIG. 4C-2. In other embodiments, the trench 118 may have a shape other than rectangular. The photoresist mask 120 protects surface regions 122 of the silicon wafer 100 surrounding the trench 118 but leaves a region of the trench 118 exposed. The etch procedure forms substantially vertical sidewall 124 and a substantially planar floor 126 of the trench 118. The floor 126 of the trench 118 is etched to the depth of the first N-type implant 114.

In the illustrative embodiment, various doping processes including formation of the P-layer 106, threshold voltage $V_T$ adjustment, punchthrough control implants, channel doping, and source/drain implants are performed prior to etching of the trench 118. In alternative embodiments, some or all of the doping processes may be performed subsequent to etching of the trench 118.

Referring to FIGS. 4D-1 and 4D-2, the photoresist mask 120 is stripped and a gate oxide layer 130 is grown overlying the silicon wafer 100, uniformly covering the surface regions 122 of the silicon wafer 100 outside the trench 118, the trench vertical sidewalls 124, and the floor 126 of the trench 118. The gate oxide layer 130 is free of defects and has a thickness in a range from 30 Å to 150 Å. The gate oxide layer 130 is formed from a high-quality oxide and is substantially free of contamination. The gate oxide layer 130 is generally composed of silicon dioxide and is formed on the top surface of the silicon wafer 100 using tube growth at a temperature of 700 to 1000° C. in an $O_2$ ambient. The gate oxide layer 130 is grown only in exposed active regions of the silicon wafer 100. The gate oxide layer 130 is formed as thin as possible to increase drain current, but formed sufficiently thick to avoid oxide breakdown and attain reliable operation.

Referring to FIGS. 4E-1 and 4E-2, a blanket layer of undoped polysilicon 132 is deposited by low pressure chemical vapor deposition (LPCVD) on the top surface of gate oxide layer 130. The undoped polysilicon 132 has a thickness of approximately 2000 Å. In some embodiments, the undoped polysilicon 132 is doped in situ during deposition. In other embodiments, the undoped polysilicon 132 is doped before etching by implanting arsenic with a dosage in the range of $1 \times 10^{15}$ to $5 \times 10^{15}$ atoms/cm$^2$ and an energy in the range of 2 to 50 kiloelectron-volts (keV). In various embodiments, the undoped polysilicon 132 is doped, typically using an N+ implant, either before etching or after etching. In some embodiments, the polysilicon is doped from a diffusion source. In the illustrative embodiment, the undoped polysilicon 132 is doped during a later process step when a dopant is introduced into the silicon wafer 100. The undoped polysilicon 132 is etched using an anisotropic dry etch process that is selective to polysilicon over $SiO_2$ etching to avoid etching of the underlying gate oxide layer 130. Anisotropic etching of polysilicon typically utilizes etch gases containing both chlorine and fluorine to avoid undercutting while maintaining high etch rates and good selectivity over $SiO_2$ etching.

Referring to FIGS. 4F-1 and 4F-2, the anisotropic dry-etch process clears the undoped polysilicon 132 in the planar areas of the surface regions 122 and the floor 126 of the silicon wafer 100 while leaving polysilicon spacers 134 on the vertical sidewalls 124 of the trench 118. The polysilicon spacers 134 are etched to an endpoint with minimal overetch so that the height of the polysilicon spacers 134 is substantially the same height as the vertical sidewalls 124 of the trench 118. For a height of 0.3 μm and a deposited polysilicon film thickness of about 0.3 μm, the width of the polysilicon spacers 134 is approximately 0.2 μm.

Referring to FIGS. 4G-1 and 4G-2, a gate polysilicon mask 136 is formed over the silicon wafer 100 and patterned using conventional photolithographic techniques. The gate polysilicon mask 136 is a photoresist mask and is used to define the structure of a plurality of polysilicon gates 138. The polysilicon gates 138 are patterned using a reactive ion etch (RIE) process that produces individual polysilicon gates 138 with substantially vertical sidewalls 140 on etched sides of the polysilicon spacers 134. The polysilicon spacers 134 are etched using an anisotropic dry etch process that is selective to polysilicon over $SiO_2$ etching to avoid etching of the underlying gate oxide layer 130. The gate polysilicon mask 136 is stripped.

Advantageously, the gate polysilicon mask 136 is selectively patterned to form different widths of the polysilicon gates 138 in a single masking procedure. The gate polysilicon mask 136 forms a pattern of transistors on multiple sides of the trench 118 to form the structure shown in FIG. 1. The gate polysilicon mask 136 forms a pattern of transistors on only one side of the trench 118 to form the structure shown in FIG. 2.

Referring to FIGS. 4H-1 and 4H-2, individual N-channel transistors 142 are formed including the individual polysilicon gates 138 in combination with the drains 110 and sources 112 previously implanted into the silicon wafer 100.

The N-channel transistors 142 have a vertical topology and a highly compact channel region. In some embodiments, lightly-doped drain (LDD) structures 144 are formed by injecting a N− implant of arsenic ions into the top surface 146 of the silicon wafer 100 and into the floor 126 of the trench 118. The LDD structures 144 are self-aligned with the polysilicon gates 138 of the vertical N-channel transistors 142. The N− implant is performed using a medium-current implanter with an ion beam that is tilted at a 7° angle to reduce implant channeling effects.

The N-channel transistors 142 formed using the illustrative fabrication technique advantageously have a very narrow channel width in the range from 0.1 μm to 0.3 μm, advantageously forming a highly compact structure in which multiple transistors are formed in a very small area.

Referring to FIG. 5, a computer system 400 includes an integrated circuit 402, a central processing unit 404, a memory 406, and an interface 408, connected to a modem 410. The computer system 400 also includes a keyboard 412 and a display 414 forming a user interface.

While the invention has been described with reference to various embodiments, it will be understood that these embodiments are illustrative and that the scope of the invention is not limited to them. Many variations, modifications, additions and improvements of the embodiments described are possible. For example, those skilled in the art will readily implement the steps necessary to provide the structures and methods disclosed herein, and will understand that the process parameters, materials, and dimensions are given by way of example only and can be varied to achieve the desired structure as well as modifications which are within the scope of the invention. Variations and modifications of the embodiments disclosed herein may be made based on the description set forth herein, without departing from the scope and spirit of the invention as set forth in the following claims.

What is claimed is:

1. An integrated circuit comprising:

a substrate wafer including a plurality of doped layers in a series of depths into the substrate wafer, the doped layers including a channel layer having a channel length defined in a vertical dimension, a shallow layer, and a deep layer, the channel layer being formed at a depth between the shallow layer and the deep layer, the deep layer being doped by a deep implant implanted through the channel layer into a deep portion of the channel layer, and the shallow layer being doped by a shallow implant implanted a shallow depth into a shallow portion of the channel layer;

a trench etched into the substrate wafer, the trench extending through the doped layers at a plurality of depths and being bounded by vertical sidewalls and a planar horizontal floor;

a conductive sidewall spacer adjacent to the vertical sidewalls of the trench so that an endpoint of the conductive sidewall spacer is substantially equal in height to the vertical sidewalls of the trench and wherein the conductive sidewall spacer is operational as a gate electrode of the integrated circuit; and a first lightly-doped drain (LDD) doped into the substrate beneath the trench, the first LDD being implanted into the substrate at an angle toward the conductive sidewall spacer and self-aligned with the conductive sidewall spacer so that the first LDD is positioned beneath the conductive sidewall spacer extending approximately to a vertical plane of the vertical sidewall.

2. An integrated circuit according to claim 1, further comprising:

a thin gate oxide layer extending over the substrate wafer, the vertical sidewalls, and the planar horizontal floor, and under the conductive sidewall spacer.

3. An integrated circuit according to claim 1, further comprising:

a plurality of conductive gates patterned from the conductive sidewall spacer.

4. An integrated circuit according to claim 1, wherein the plurality of doped layers further comprise:

a channel layer of a first conductivity type;

a source layer of a second conductivity type opposite in conductivity to the first conductivity type; and a drain layer of a second conductivity type opposite in conductivity to the first conductivity type, the drain layer being separated from the source layer by the channel layer.

5. An integrated circuit according to claim 1, further comprising:

an interconnect structure patterned from the conductive sidewall.

6. An integrated circuit according to claim 1, wherein the plurality of doped layers further comprise:

a channel layer of a first conductivity type;

a source layer of a second conductivity type opposite in conductivity to the first conductivity type; and a drain layer of a second conductivity type opposite in conductivity to the first conductivity type, the drain layer being separated from the source layer by the channel layer; further including:

a thin gate oxide layer over the substrate wafer, the vertical sidewalls, and the planar horizontal floor prior and under the conductive sidewall spacer; and a plurality of conductive gates patterned from the conductive sidewall spacer.

7. An integrated circuit according to claim 6, wherein:

the first conductivity type is a P-type;

the second conductivity type is an N-type; and the source, drain and plurality of conductive gates form a plurality of vertical P-channel transistors.

8. An integrated circuit according to claim 7, wherein:

the vertical P-channel transistors are formed with a channel length in a range from approximately 0.025 $\mu$m to 0.25 $\mu$m.

9. An integrated circuit comprising:

a substrate wafer including a plurality of horizontal planar doped layers at a corresponding plurality of depths into the substrate wafer, the doped layers including a channel layer having a channel length defined in a vertical dimension, a shallow layer, and a deep layer, the channel layer being formed at a depth between the shallow layer and the deep layer, the deep layer being doped by a deep implant implanted through the channel layer into a deep portion of the channel layer, and the shallow layer being doped by a shallow implant implanted a shallow depth into a shallow portion of the channel layer, the substrate wafer having a trench etched into a plurality of the horizontal planar doped layers, the trench being bounded by vertical sidewalls and a planar horizontal floor;

a thin gate oxide layer over the substrate wafer, the vertical sidewalls, and the planar horizontal floor;

a plurality of conductive gates patterned from a conductive sidewall spacer formed on the vertical sidewalls by deposition of a conductive layer into the trench and etching of the conductive layer wherein an endpoint of the conductive sidewall spacer is substantially equal in height to the vertical sidewalls of the trench; and a first lightly-doped drain (LDD) doped into the substrate beneath the trench, the first LDD being implanted into the substrate at an angle toward the conductive sidewall spacer and self-aligned with the conductive sidewall spacer so that the first LDD is positioned beneath the conductive sidewall spacer extending approximately to a vertical plane of the vertical sidewall.

10. An integrated circuit according to claim 9, wherein the plurality of doped layers further comprises:

a channel layer of a first conductivity type;

a source layer of a second conductivity type opposite in conductivity to the first conductivity type; and a drain layer of a second conductivity type opposite in conductivity to the first conductivity type, the drain layer being separated from the source layer by the channel layer.

11. An integrated circuit according to claim 9, wherein the plurality of doped layers further comprises:

a channel layer of a first conductivity type;

a source layer of a second conductivity type opposite in conductivity to the first conductivity type; and a drain layer of a second conductivity type opposite in conductivity to the first conductivity type, the drain layer being separated from the source layer by the channel layer; further including:

a thin gate oxide layer over the substrate wafer, the vertical sidewalls, and the planar horizontal floor prior and under the conductive sidewall spacer; and a plurality of conductive gates patterned from the conductive sidewall spacer.

12. An integrated circuit according to claim 11, wherein:

the first conductivity type is a P-type;

the second conductivity type is an N-type; and the source, drain and plurality of conductive gates form a plurality of vertical P-channel transistors.

13. An integrated circuit according to claim 12, wherein:

the vertical P-channel transistors are formed with a channel length in a range from approximately 0.025 $\mu$m to 0.25 $\mu$m.

14. An integrated circuit according to claim 1, wherein:

the shallow layer and the deep layer include a source layer and a drain layer.

15. An integrated circuit according to claim 1, wherein:

the first lightly-doped drain (LDD) is self-aligned with the conductive sidewall spacer and implanted into the substrate beneath the trench at an angle to reduce implant channeling effects.

16. An integrated circuit according to claim 1, further comprising:

a second lightly-doped drain (LDD) is doped into the channel layer adjacent to the vertical sidewall of the trench, the second LDD being implanted into the channel layer at an angle toward the conductive sidewall spacer and self-aligned with the conductive sidewall spacer so that the second LDD is positioned near the vertical sidewall of the trench and extending into the channel layer from the vertical sidewall.

17. An integrated circuit according to claim 16, wherein:

the second lightly-doped drain (LDD) is doped into the channel layer adjacent to the vertical sidewall of the trench, self-aligned with the conductive sidewall spacer, and implanted through the vertical sidewall at an angle to reduce implant channeling effects.

18. An integrated circuit comprising:

a substrate;

a semiconductor device including a plurality of successive layers at successive depths into the substrate beginning at a surface of the substrate, adjacent layers of the successive layers having mutually different conductivity types, the different conductivities being created by implanting impurities into the substrate from the surface of the substrate including implanting of impurities into a layer distal to the surface through a layer proximal to the distal layer by a high-energy implant that preferentially implants impurities at the distal layer depth;

a vertical sidewall intersecting the plurality of successive layers formed by etching the substrate;

a thin oxide layer formed on the vertical sidewall;

a conductive sidewall spacer formed on the thin oxide layer along the vertical sidewall and operational as a gate electrode of the integrated circuit wherein an endpoint of the conductive sidewall spacer is substantially equal in height to the vertical sidewalls of the trench; and a first lightly-doped drain (LDD) doped into the substrate beneath the trench, the first LDD being implanted into the substrate at an angle toward the conductive sidewall spacer and self-aligned with the conductive sidewall spacer so that the first LDD is positioned beneath the conductive sidewall spacer extending approximately to a vertical plane of the vertical sidewall.

19. An integrated circuit according to claim 18, wherein:

the plurality of successive layers includes a channel layer formed adjacent to and between a source layer and a drain layer.

20. An integrated circuit according to claim 19, wherein:

the source layer and a drain layer include a layer implanted with impurities at a low energy along a proximal depth into the channel layer and a layer implanted with impurities at a high energy through and past a substantial portion of the channel layer into a distal depth of the channel layer.

21. An integrated circuit according to claim 20, wherein:

the source layer and a drain layer include a layer implanted with phosphorus or arsenic impurities at a dosage in a range from $1 \times 10^{15}$ to $5 \times 10^{15}$ atoms/cm$^2$ and an energy in a range of 2 keV to 30 keV along the surface of the substrate, and a layer implanted with phosphorus or arsenic impurities at a dosage in a range from $1 \times 10^{15}$ to $5 \times 10^{15}$ atoms/cm$^2$ and an energy in a range of 100 keV to 300 keV at a depth of approximately 0.3 $\mu$m into the substrate.

22. An integrated circuit according to claim 9 wherein:

the first lightly-doped drain (LDD) is self-aligned with the conductive sidewall spacer and implanted into the substrate beneath the trench at an angle to reduce implant channeling effects.

23. An integrated circuit according to claim 9, further comprising:

a second lightly-doped drain (LDD) is doped into the channel layer adjacent to the vertical sidewall of the trench, the second LDD being implanted into the channel layer at an angle toward the conductive sidewall spacer and self-aligned with the conductive sidewall spacer so that the second LDD is positioned near the vertical sidewall of the trench and extending into the channel layer from the vertical sidewall.

24. An integrated circuit according to claim 23, wherein:

the second lightly-doped drain (LDD) is doped into the channel layer adjacent to the vertical sidewall of the trench, self-aligned with the conductive sidewall spacer, and implanted through the vertical sidewall at an angle to reduce implant channeling effects.

25. An integrated circuit according to claim 18, further comprising:

a second lightly-doped drain (LDD) is doped into the channel layer adjacent to the vertical sidewall of the trench, the second LDD being implanted into the channel layer at an angle toward the conductive sidewall spacer and self-aligned with the conductive sidewall spacer so that the second LDD is positioned near the vertical sidewall of the trench and extending into the channel layer from the vertical sidewall.

* * * * *